US008927426B2

United States Patent
Lee et al.

(10) Patent No.: US 8,927,426 B2
(45) Date of Patent: Jan. 6, 2015

(54) SEMICONDUCTOR DEVICES HAVING THROUGH-VIAS AND METHODS FOR FABRICATING THE SAME

(71) Applicant: Samsung Electronics Co., Ltd., Suwon-si (KR)

(72) Inventors: Ho-Jin Lee, Seoul (KR); Pil-Kyu Kang, Anyang-si (KR); Kyu-Ha Lee, Yongin-si (KR); Gilheyun Choi, Seoul (KR); YongSoon Choi, Yongin-si (KR); Byung Lyul Park, Seoul (KR); Hyunsoo Chung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/766,326

(22) Filed: Feb. 13, 2013

(65) Prior Publication Data

US 2013/0207242 A1    Aug. 15, 2013

(30) Foreign Application Priority Data

Feb. 13, 2012 (KR) .................. 10-2012-0014363

(51) Int. Cl.
*H01L 21/302* (2006.01)
*H01L 29/40* (2006.01)
(Continued)

(52) U.S. Cl.
CPC ........ *H01L 23/481* (2013.01); *H01L 21/76898* (2013.01); *H01L 25/0657* (2013.01); *H01L 24/05* (2013.01); *H01L 24/06* (2013.01); *H01L 23/3128* (2013.01); *H01L 2224/0557* (2013.01);
(Continued)

(58) Field of Classification Search
CPC .............. H01L 23/055; H01L 23/5384; H01L 2224/16148; H01L 2224/16146
USPC .......................................... 438/667; 257/621
See application file for complete search history.

(56) References Cited

U.S. PATENT DOCUMENTS 7,094,701 B2    8/2006 Umemoto et al.
7,282,444 B2    10/2007 Tanida et al.
(Continued)

FOREIGN PATENT DOCUMENTS

JP    2005-243689    9/2005
JP    2007-242812    9/2007

*Primary Examiner* — Caridad Everhart
(74) *Attorney, Agent, or Firm* — Myers Bigel Sibley & Sajovec, PA

(57) ABSTRACT

Semiconductor devices having through-vias and methods for fabricating the same are described. The method may include forming a hole opened toward a top surface of a substrate and partially penetrating the substrate, forming a sacrificial layer partially filling the hole, forming a through-via in the hole partially filled with the sacrificial layer, forming a via-insulating layer between the through-via and the substrate, and exposing the through-via through a bottom surface of the substrate. Forming the sacrificial layer may include forming an insulating flowable layer on the substrate, and constricting the insulating flowable layer to form a solidified flowable layer.

14 Claims, 18 Drawing Sheets

(51) Int. Cl.
  *H01L 23/48* (2006.01)
  *H01L 21/768* (2006.01)
  *H01L 25/065* (2006.01)
  *H01L 23/00* (2006.01)
  *H01L 23/31* (2006.01)

(52) U.S. Cl.
  CPC ............... *H01L 2225/06517* (2013.01); *H01L 2924/15311* (2013.01); *H01L 2225/06513* (2013.01); *H01L 2225/06565* (2013.01); *H01L 2225/06544* (2013.01); *H01L 24/13* (2013.01); *H01L 24/16* (2013.01); *H01L 2224/02372* (2013.01); *H01L 2224/05548* (2013.01); *H01L 2224/05567* (2013.01); *H01L 2224/06181* (2013.01); *H01L 2224/13022* (2013.01); *H01L 2224/16148* (2013.01); *H01L 2224/16227* (2013.01); *H01L 2224/05572* (2013.01); *H01L 2224/131* (2013.01); *H01L 2224/16225* (2013.01)
  USPC .......................................... 438/667; 257/621

(56) References Cited

U.S. PATENT DOCUMENTS

| | | | |
|---|---|---|---|
| 7,358,602 B2 | 4/2008 | Hara | |
| 7,994,048 B2 | 8/2011 | Komuro | |
| 8,026,592 B2 | 9/2011 | Yoon et al. | |
| 8,039,962 B2 | 10/2011 | Lee et al. | |
| 8,053,902 B2 | 11/2011 | Chen et al. | |
| 2006/0163640 A1* | 7/2006 | Park et al. | 257/306 |
| 2011/0133333 A1* | 6/2011 | Kwon et al. | 257/737 |
| 2012/0028454 A1* | 2/2012 | Swaminathan et al. | 438/558 |

\* cited by examiner

SEMICONDUCTOR DEVICES HAVING THROUGH-VIAS AND METHODS FOR FABRICATING THE SAME

CROSS-REFERENCE TO RELATED APPLICATION

This U.S. non-provisional patent application claims priority under 35 U.S.C. §119 to Korean Patent Application No. 10-2012-0014363, filed on Feb. 13, 2012, the entirety of which is incorporated by reference herein.

FIELD

The inventive concept relates to semiconductors and, more particularly, to semiconductor devices having through-vias and methods for fabricating the same.

BACKGROUND

Generally, a silicon oxide layer may be formed by a chemical vapor deposition (CVD) for electrical insulation between a through-silicon via and a substrate. As a size of the through-silicon via becomes reduced, it may be required to reduce a thickness of an insulating layer formed on a sidewall of the through-silicon via. The insulating layer may also be formed under the through-silicon via. Securing high etch selectivity between the substrate and the insulating layer may be very important in a process that projects the through-silicon via by recessing a bottom surface of the substrate. If the insulating layer is etched during the process of protruding the through-silicon via, the through-silicon via may be exposed. The exposed portion of the through-silicon via may act as a contamination or particle source. As a result, errors in subsequent processes may occur. Thus, it may be desired to improve etching margin of the insulating layer in the process of protruding the through-silicon via.

SUMMARY

Embodiments of the inventive concept may provide semiconductor devices capable of improving etching margin of a through-via-insulating layer in a process of protruding a through-via and methods for fabricating the same.

Embodiments of the inventive concept may also provide semiconductor devices capable of sufficiently securing electrical insulation between a through-via and a substrate and methods for fabricating the same.

Embodiments of the inventive concept may also provide semiconductor devices capable of preventing, reducing, or minimizing process error so as to improve electrical reliability and yield and methods for fabricating the same.

According to some features of the inventive concept, a sacrificial layer may be formed under a through-via. According to other features of the inventive concept, the sacrificial layer may be formed by a flowable chemical vapor deposition method. According to still other features of the inventive concept, the sacrificial layer may further be formed under the through-via by the flowable chemical vapor deposition method, such that it is possible to sufficiently secure an etching margin of an insulating layer around the through-via.

In one aspect, a method for fabricating a semiconductor device may include: forming a hole opened toward a top surface of a substrate, the hole partially penetrating the substrate; forming a sacrificial layer partially filling the hole; forming a through-via in the hole partially filled with the sacrificial layer; forming a via-insulating layer between the through-via and the substrate; and exposing the through-via through a bottom surface of the substrate. Forming the sacrificial layer may include: forming an insulating flowable layer on the substrate; and constricting the insulating flowable layer to form a solidified flowable layer.

In some embodiments, forming the via-insulating layer may include: after forming the sacrificial layer, forming an insulating layer extending along a surface of the sacrificial layer and an inner sidewall of the hole.

In other embodiments, forming the via-insulating layer may include: before forming the sacrificial layer, forming a first insulating layer extending an inner surface of the hole.

In still other embodiments, forming the via-insulating layer may further include: after forming the sacrificial layer, forming a second insulating layer extending a surface of the sacrificial layer and an inner sidewall of the first insulating layer in the hole.

In yet other embodiments, forming the insulating flowable layer may include: providing a silicon-contained compound and an oxidizing agent on the substrate; and condensing the silicon-contained compound and the oxidizing agent.

In yet still other embodiments, forming the solidified flowable layer may include: performing a plasma treatment or an annealing treatment on the insulating flowable layer to convert the insulating flowable layer into a constricted silicon oxide layer having a solid phase.

In yet still other embodiments, exposing the through-via may include: recessing the bottom surface of the substrate to expose a lower end of the through-via, the lower end of the through-via being surrounded by the sacrificial layer; forming a lower insulating layer covering the sacrificial layer on the recessed bottom surface; and planarizing the lower insulating layer and the sacrificial layer to expose the lower end of the through-via.

In yet still other embodiments, exposing the through-via may include: recessing the bottom surface of the substrate to expose the sacrificial layer without protruding the through-via; forming a lower insulating layer on the recessed bottom surface; and selectively removing the sacrificial layer and the via-insulating layer to expose a lower end of the through-via.

In yet still other embodiments, the method may further include: forming a barrier metal layer between the via-insulating layer and the through-via.

In yet still other embodiments, the method may further include at least one of the following: forming an integrated circuit and a metal interconnection electrically connected to the through-via on the top surface of the substrate; forming an upper terminal connected to the metal interconnection and electrically connected to the through-via; and/or forming a lower electrode electrically connected to the through-via on the bottom surface of the substrate.

In another aspect, a semiconductor device may include: a substrate having an active surface, a non-active surface, and a via-hole extending from the active surface to the non-active surface; a through-via provided in the via-hole; a via-insulating layer extending along an inner sidewall of the via-hole and surrounding a sidewall of the through-via; a sacrificial layer extending along the inner sidewall of the via-hole from the via-insulating layer to the non-active surface of the substrate; a lower insulating layer covering the non-active surface of the substrate; and a terminal provided on the lower insulating layer and electrically connected to the through-via.

In some embodiments, the sacrificial layer may include a flowable chemical vapor deposition layer, and the via-insulating layer may include a non-flowable chemical vapor deposition layer In other embodiments, the through-via may include a lower end not reaching the non-active surface of the substrate. The terminal may include a protruded portion that protrudes toward the via-hole and is connected to the lower end of the through-via. The protruded portion may be electrically insulated from the substrate by the sacrificial layer.

In still other embodiments, the sacrificial layer may have a thickness substantially equal to that of the via-insulating layer, and the protruded portion of the terminal may have a width substantially equal to a width of the lower end of the through-via.

In yet other embodiments, the sacrificial layer may have a second thickness greater than that of the via insulating layer, and the protruded portion of the terminal may have a width less than that of the lower end of the through-via.

In yet still other embodiments, the through-via may include a lower end that protrudes outward from the non-active surface of the substrate. The sacrificial layer may surround a sidewall of the lower end of the through-via.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
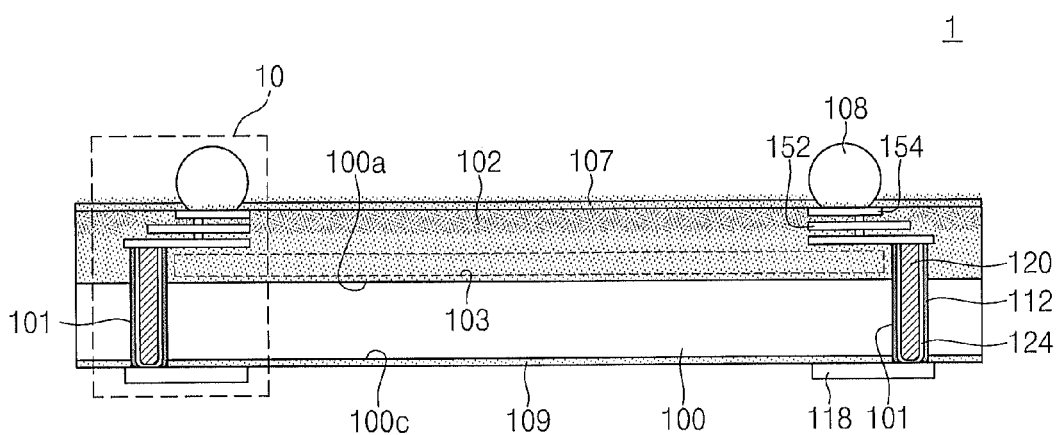
FIG. 1 is a cross-sectional view illustrating a semiconductor device according to embodiments of the inventive concept.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a cross-sectional view illustrating a semiconductor device according to embodiments of the inventive concept.

Referring to FIG. 1, a semiconductor device 1 may include an electrical connection part 10 that transmits an electrical signal. The electrical signal may vertically pass through a substrate 100 via the electrical connection part 10. The electrical connection part 10 may include a through-via 120 substantially vertically penetrating the substrate 100. The through-via 120 may include a conductive layer, which fills a via-hole 101 vertically penetrating the substrate 100. Additionally, the through-via 120 may further include a barrier layer 124 surrounding the conductive layer. A via-insulating layer 112 may be disposed on a sidewall of the via-hole 101. The via-insulating layer 112 electrically isolates the through-via 120 from the substrate 100. The semiconductor device 1 may further include at least one of an upper terminal 108 and a lower terminal 118. The upper terminal 108 may be disposed on an active surface 100a of the substrate 100 and be electrically connected to the through-via 120. The lower terminal 118 may be disposed on a non-active surface 100c of the substrate 100 and be electrically connected to the through-via 120. The upper terminal 108 and the lower terminal 118 may include a solder ball, a solder bump, a re-interconnection, and/or pad. In some embodiments, the upper terminal 108 may include a solder ball and the lower terminal 118 may include a pad. However, the inventive concept is not limited thereto.

An integrated circuit 103, a metal interconnection 152, and an interlayer insulating layer 102 may be disposed on the active surface 100a of the substrate 100. The metal interconnection 152 may be electrically connected to the integrated circuit 103 and have a single-layered structure or a multi-layered structure. The interlayer insulating layer 102 may cover the integrated circuit 103 and the metal interconnection 152. An upper insulating layer 107 may be disposed on the interlayer insulating layer 102. The upper insulating layer 107 may open a bonding pad 154 connected to the upper terminal 108. The metal interconnection 152 may be electrically connected to the through-via 120, such that the integrated circuit 103 may be electrically connected to the through-via 120. The through-via 120 may be disposed around the integrated circuit 103 or in the integrated circuit 103. The electrical connection part 10 may include one of the connection parts 11, 12, 13, and 14 of various structures as described with reference to FIGS. 2A to 2D below. A lower insulating layer 109 may be disposed on the non-active surface 100c. The lower insulating layer 109 may open the through-via 120 to which the lower terminal 118 is connected.

<Examples of Electrical Connection Part>

FIGS. 2A to 2D are cross-sectional views illustrating various examples of an electrical connection part of a semiconductor device according to embodiments of the inventive concept.

Figure 2A:
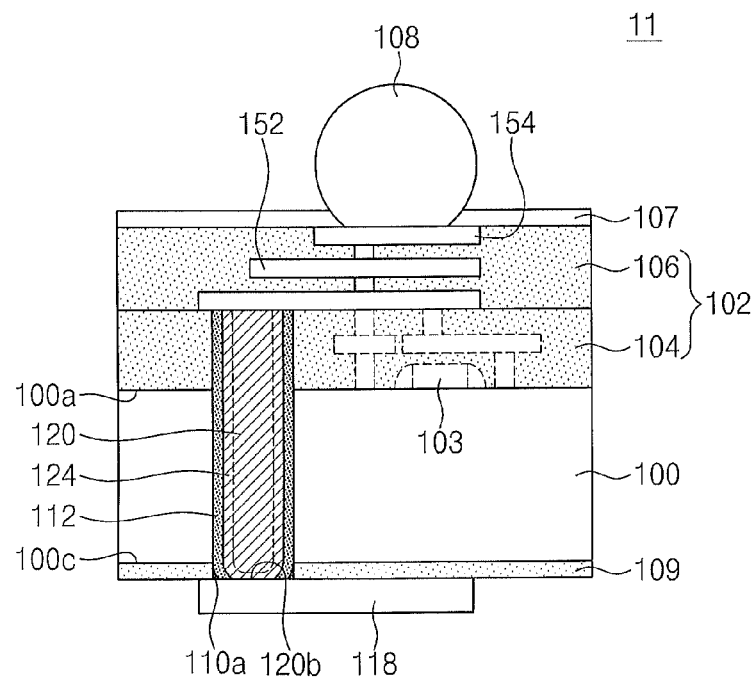
FIGS. 2A to 2D are cross-sectional views illustrating various examples of an electrical connection part of a semiconductor device according to embodiments of the inventive concept.

Referring to FIG. 2A, the electrical connection part 11 may have a via-middle structure. In the via-middle structure, the through-via 120 may be formed after the formation of the integrated circuit 103 and before the formation of the metal interconnection 152. The interlayer insulating layer 102 may include a first interlayer insulating layer 104 and a second interlayer insulating layer 106. The first interlayer insulating layer 104 may be formed on the active surface 100a of the substrate 100 and cover the integrated circuit 103. The second interlayer insulating layer 106 may be formed on the first interlayer insulating layer 104 and cover the metal interconnection 142 and the bonding pad 154. The through-via 120 may successively penetrate the first interlayer insulating layer 104 and the substrate 100. The through-via 120 may protrude outward from the non-active surface 100c of the substrate 100. A sidewall of the protruded lower end 120b of the through-via 120 may be surrounded by the via-insulating layer 112. The via-insulating layer 112 may be a chemical vapor deposition (CVD) layer.

Figure 4A:
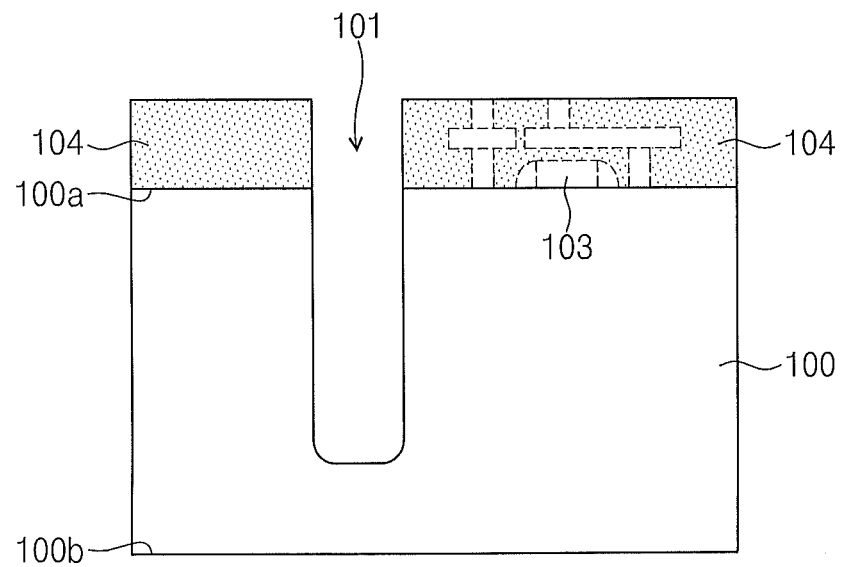
FIGS. 4A to 4H are cross-sectional views illustrating a method for fabricating a semiconductor device according to some embodiments of the inventive concept.
Figure 4B:
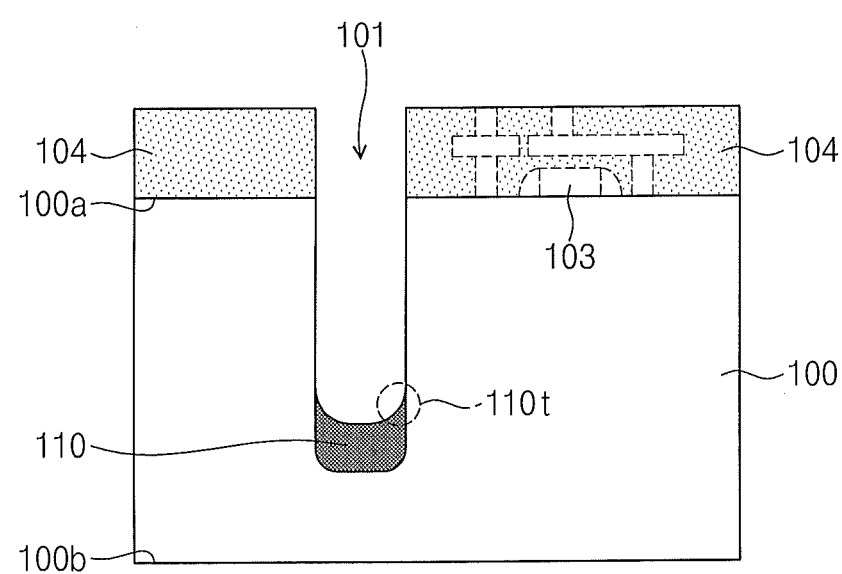
Figure 4C:
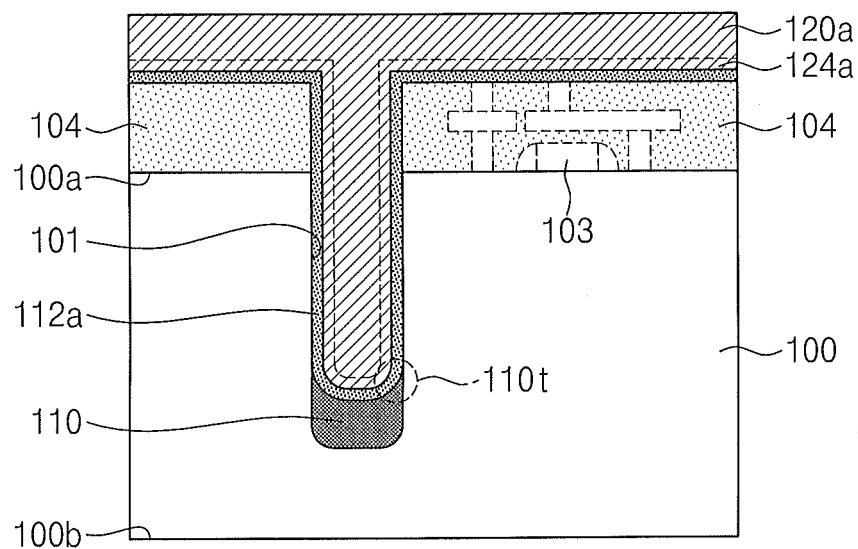
Figure 4D:
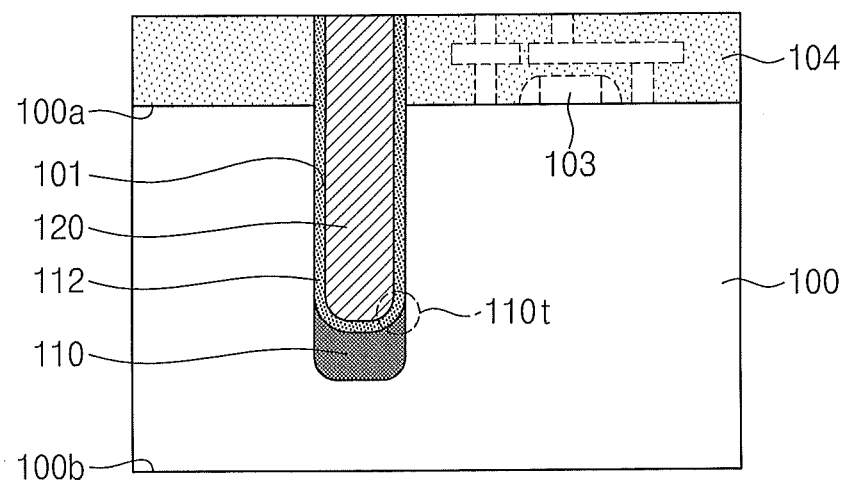
Figure 4E:
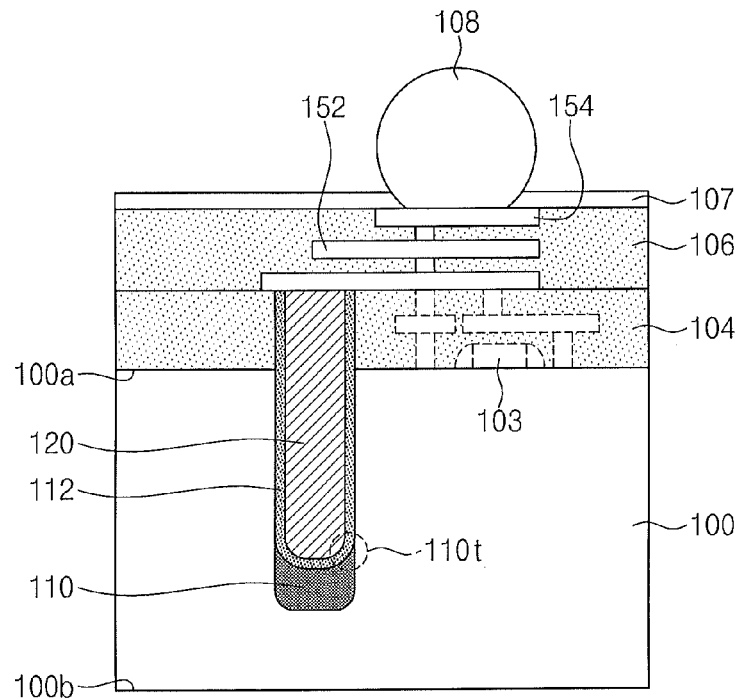
Figure 4F:
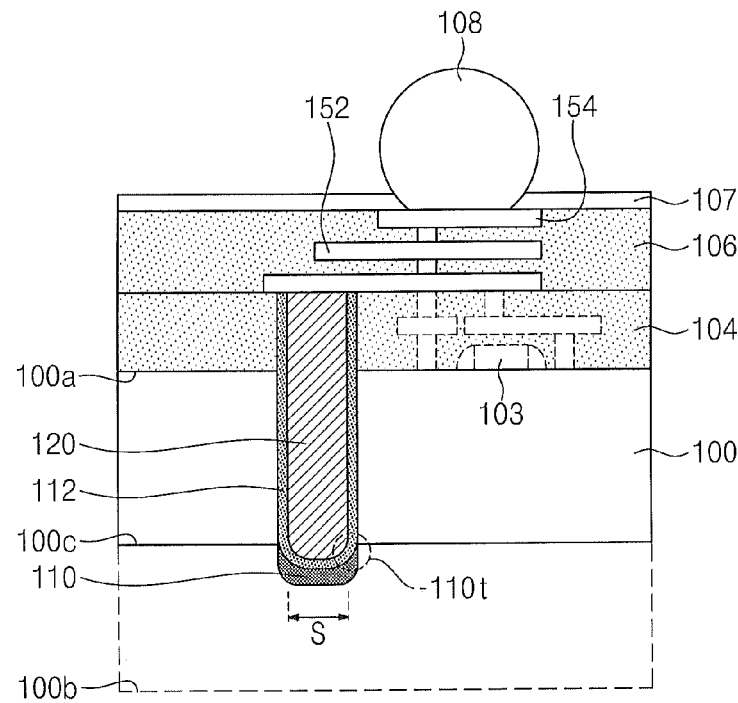
Figure 4G:
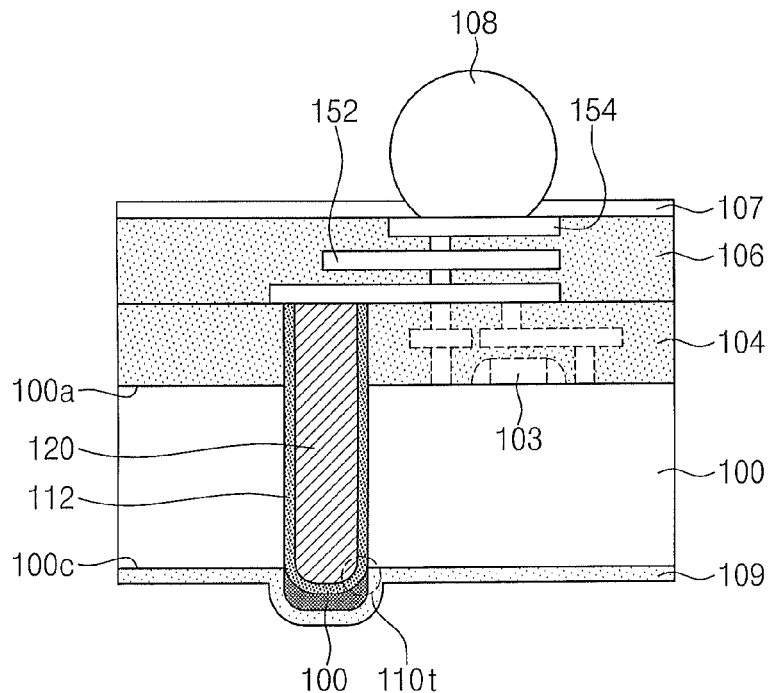
Figure 4H:
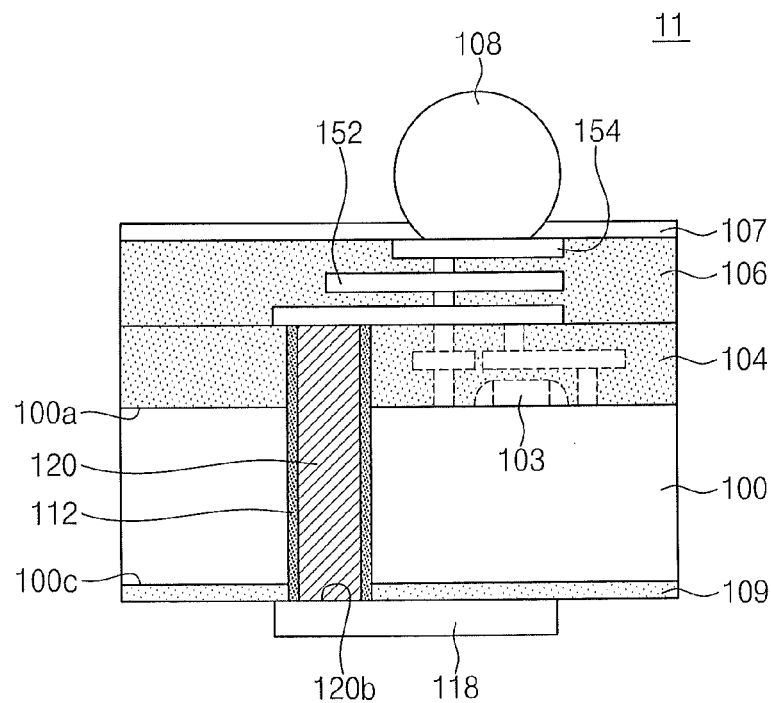
Figure 4I:
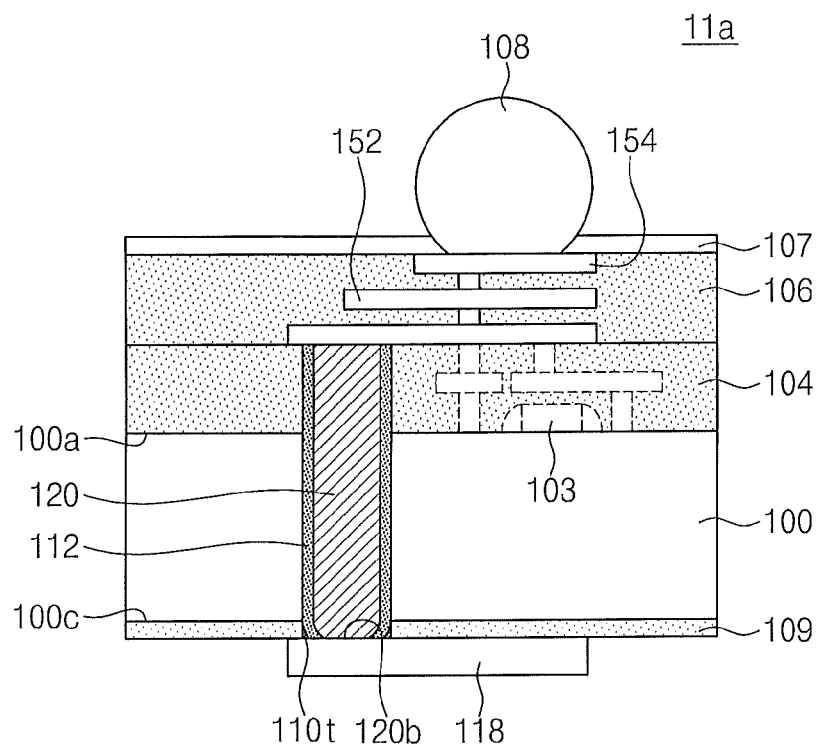
FIG. 4I is a cross-sectional view illustrating a modified example of the device of FIG. 4H.
Figure 4J:
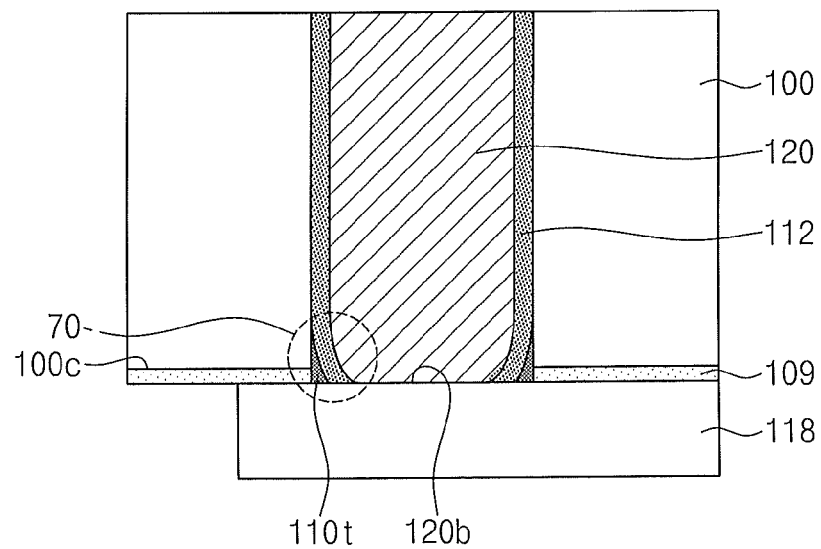
FIGS. 4J to 4L are enlarged views of a portion of the device of FIG. 4I.
Figure 4K:
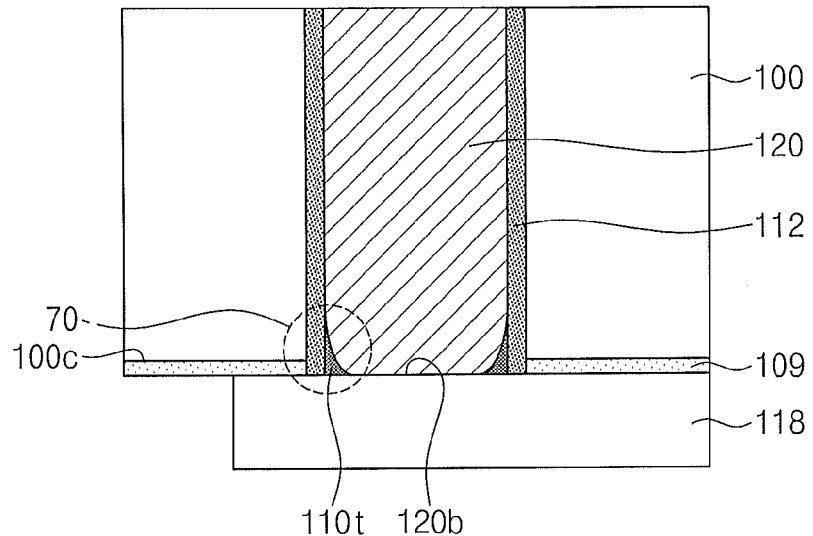
Figure 4L:
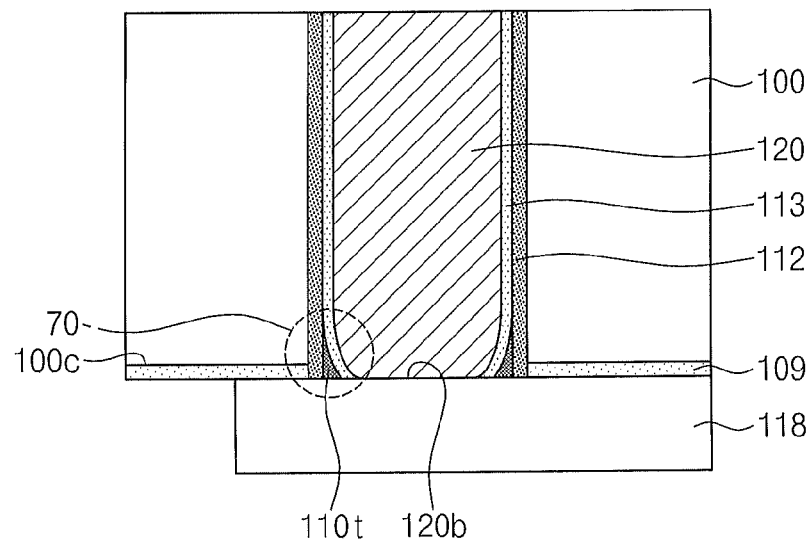

In a modified example of the present example, as illustrated in FIG. 4I, an electrical connection part 11a may further include a tail 110t surrounding the sidewall of the lower end 120b of the through-via 120. In this case, as illustrated in FIG. 4J, the sidewall of the lower end 120b of the through-via 120 may be directly in contact with the via-insulating layer 112, and the tail 110t may surround the via-insulating layer 112. Thus, the via-insulating layer 112 and the tail 110t may constitute a double layer structure to suppress a contact of the substrate 100 and the sidewall of the lower end 120b of the through-via 120 adjacent to the non-active surface 100c of the substrate 100. The tail 110t may be a portion of sacrificial layer (110 of FIG. 4B) formed of a flowable chemical vapor deposition (FCVD) layer. In other embodiments, as illustrated in FIG. 4K, the sidewall of the lower end 120b of the through-via 120 may be directly in contact with the tail 110t, and the via-insulating layer 112 may surround the tail 110t. In still other embodiments, as illustrated in FIG. 4L, a second via-insulating layer 113 may be further provided between the through-via 120 and the via-insulating layer 112. In this case, the sidewall of the lower end 120b of the through-via 120 may be directly in contact with the second via-insulating layer 113, and the tail 110t and the via-insulating layer 112 may surround the second via-insulating layer 113 in contact with the sidewall of the lower end 120b of the through-via 120.

Figure 2B:
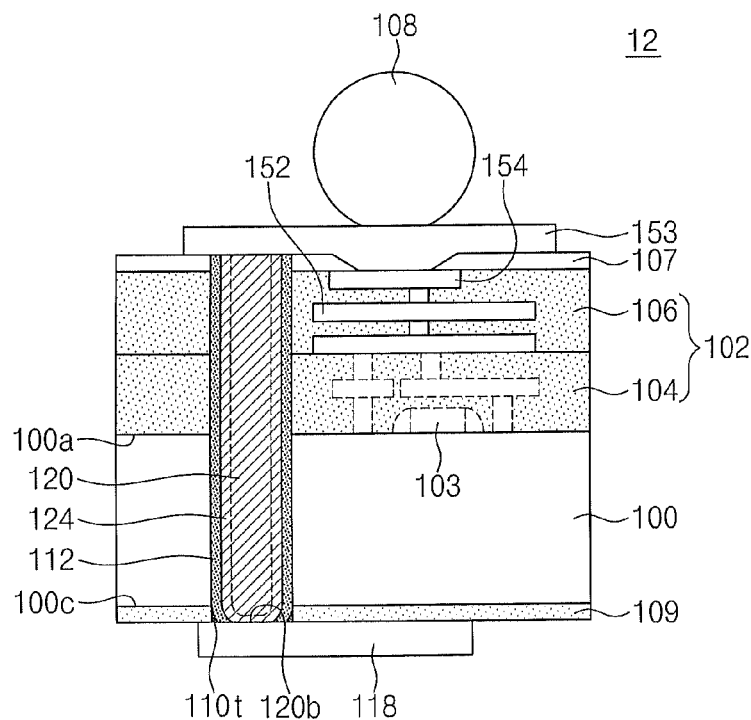

Referring to FIG. 2B, the electrical connection part 12 may have a via-last structure. In the via-last structure, the through-via 120 may be formed after the integrated circuit 103 and the metal interconnection 152 are sequentially formed. The through-via 120 may successively penetrate the second interlayer insulating layer 106, the first interlayer insulating layer 104, and the substrate 100. An upper interconnection 153 may further be formed on the upper insulating layer 107. The upper interconnection 153 may electrically connect the through-via 120 and the bonding pad 154 to each other. The through-via 120 may further penetrate the upper insulating layer 107 to be connected to the upper interconnection 153. The upper terminal 108 may be connected to the bonding pad 154 through the upper interconnection 153, such that the upper terminal 108 may be electrically connected to the metal interconnection 152. The tail 110t may be provided to surround the sidewall of the lower end 120b of the through-via 120. In other embodiments, the tail 110t may be omitted.

Figure 2C:
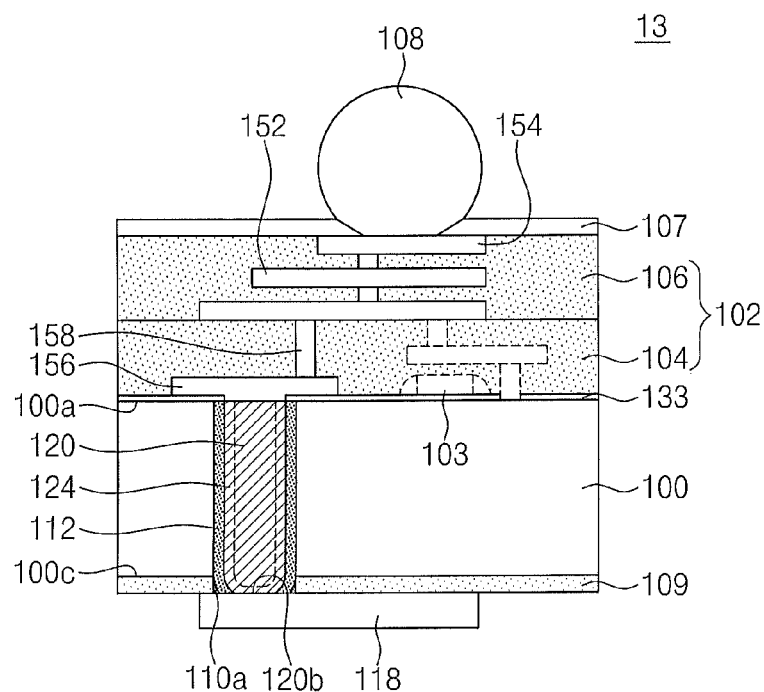

Referring to FIG. 2C, the electrical connection part 13 may have a via-first structure. In the via-first structure, after the through-via 120 is formed to penetrate the substrate 100, the integrated circuit 103 and the metal interconnection 152 may be sequentially formed. A connecting interconnection 156 may further be formed on the active surface 100a of the substrate 100 with an insulating layer 133 therebetween. The connecting interconnection 156 may be electrically connected to the through-via 120. The through-via 120 may be electrically connected to the metal interconnection 152 and/or the integrated circuit 103 through a via 158 connecting the connecting interconnection 156 and the metal interconnection 152 to each other. The tail 100t may be provided to surround the sidewall of the lower end 120b of the through-via 120. In other embodiments, the tail 110t may be omitted.

Figure 2D:
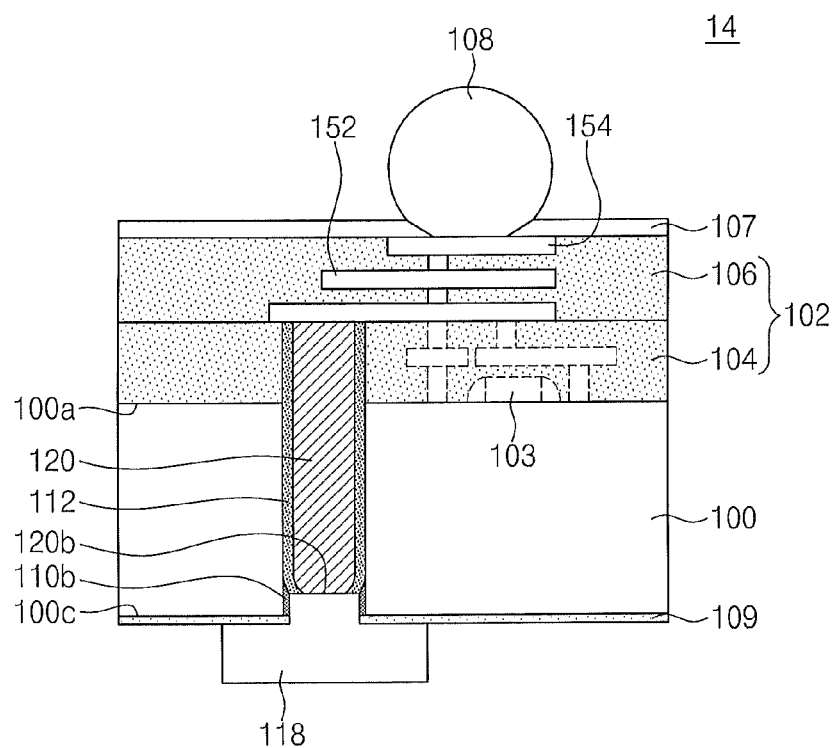

Referring to FIG. 2D, the electrical connection part 14 may include the through-via 120 recessed with respect to the non-active surface 100c of the substrate 100. For example, the lower end 120b of the through-via 120 may be disposed at a level higher than the non-active surface 100c of the substrate 100. The lower terminal 118 may include a portion that protrudes toward the lower end 120b of the through-via 120. The electrical connection part 14 may include the via-insulating layer 112 extending along a sidewall of the through-via 120 to the lower end 120b of the through-via 120 or to a level lower than the lower end 120b. Additionally, the electrical connection part 14 may further include a sacrificial layer 110b extending from the via-insulating layer 112 to the non-active surface 100c of the substrate 100. The via-insulating layer 112 may electrically insulate the through-via 120 from the substrate 100, and the sacrificial layer 110b may electrically insulate the lower terminal 118 from the substrate 100. The sacrificial layer 110b may be a flowable CVD layer. The via-insulating layer 112 may have a thickness equal to, similar to, or different from that of the sacrificial layer 110b. This will be described in more detail with reference to FIGS. 6E to 6G. The electrical connection part 14 may include the via-middle structure, the via-last structure of FIG. 2B or 2C, or the via-first structure.

<Example of Semiconductor Package>

Figure 3:
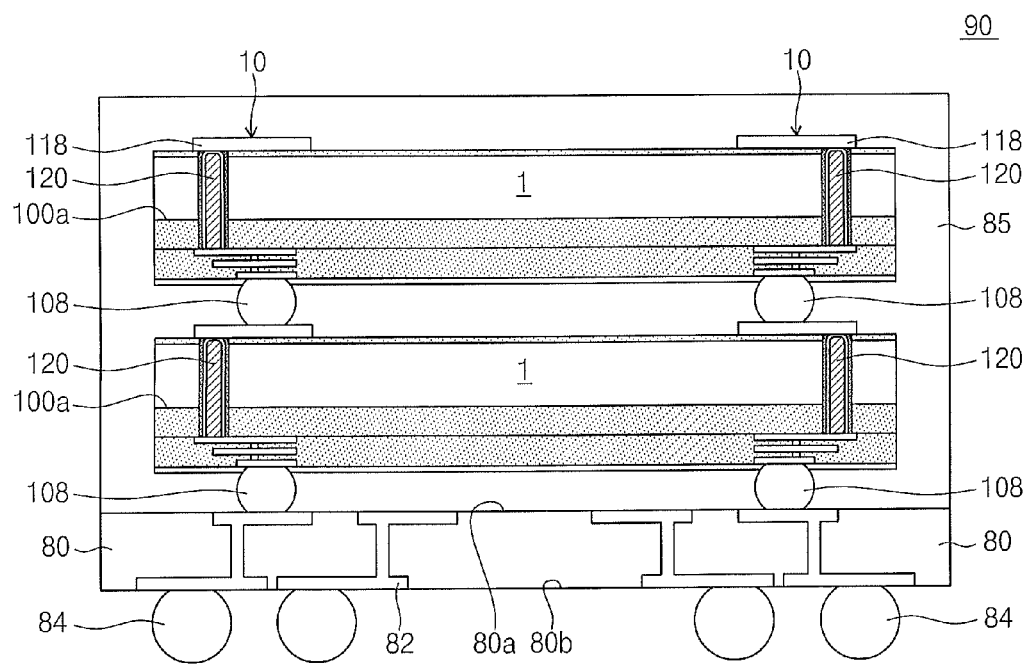
FIG. 3 is a cross-sectional view illustrating a semiconductor package including a semiconductor device of FIG. 1.

FIG. 3 is a cross-sectional view illustrating a semiconductor package including a semiconductor device of FIG. 1.

Referring to FIG. 3, a semiconductor package 90 may include a package substrate 80 and one or more semiconductor devices 1 of FIG. 1 mounted on the package substrate 80. The semiconductor package 90 may further include a molding layer 80 molding the semiconductor devices 1. The package substrate 80 may include a top surface 80a and a bottom surface 80b opposite to the top surface 80a. The package substrate 80 may be a printed circuit board (PCB) within which electrical connecting interconnections 82 are included. The semiconductor devices 1 may be mounted on the top surface 80a of the package substrate 80 in a face down state, such that active surfaces 100a of the semiconductor devices 1 face the package substrate 80. The semiconductor package 90 may further include one or more solder balls 84, which are adhered on the bottom surface 80b of the package substrate 80 and are connected to the electrical connecting interconnection 82. In the present embodiment, the electrical connections between the semiconductor devices 1 and between the semiconductor devices 1 and the package substrate 80 may be realized by the through-vias 120. The electrical connection parts 10 of the semiconductor devices 1 may be replaced with one of the electrical connection parts 11 to 14 illustrated in FIGS. 2A to 2D.

<Embodiment of Fabricating Method>

Figure 5A:
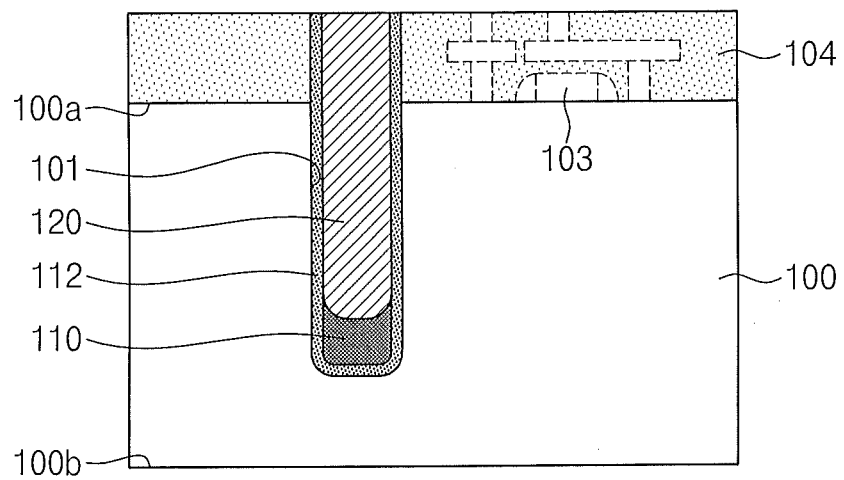
FIGS. 5A and 5B are cross-sectional views illustrating modified examples of the device of FIG. 4D.
Figure 5B:
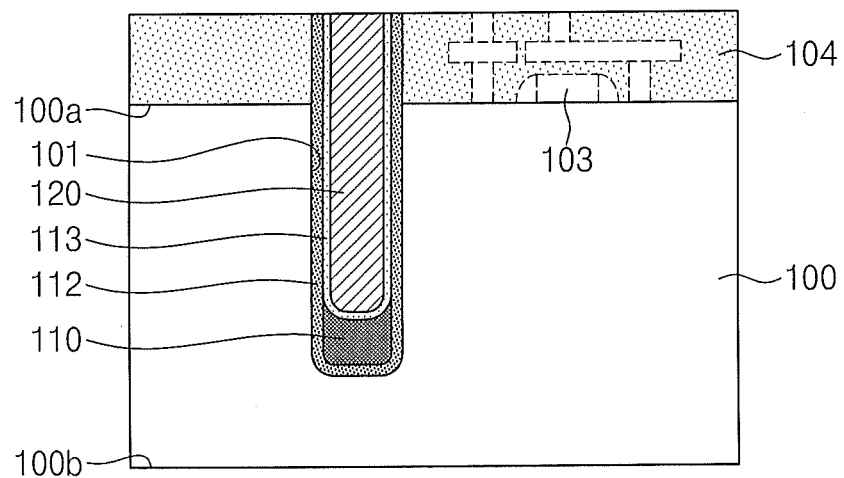

FIGS. 4A to 4H are cross-sectional views illustrating a method for fabricating a semiconductor device according to some embodiments of the inventive concept. FIG. 4I is a cross-sectional view illustrating a modified example of the device of FIG. 4H. FIGS. 4J to 4L are enlarged views of a portion of FIG. 4I. FIGS. 5A and 5B are cross-sectional views illustrating modified examples of the device of FIG. 4D.

Referring to FIG. 4A, a via-hole 101 may be formed to substantially vertically penetrate a substrate 100. The substrate 100 may include a top surface 100a and a first bottom surface 100b opposite to the top surface 100a. An integrated circuit 103 may be formed on the top surface 100a of the substrate 100. A first interlayer insulating layer 104 covering the integrated circuit 103 may be formed on the top surface 100a of the substrate 100. The substrate 100 may be a silicon substrate including a semiconductor material, such as silicon. The integrated circuit 103 may include a memory circuit, a logic circuit, or combination thereof. The first interlayer insulating layer 104 may be formed by depositing a silicon oxide layer or a silicon nitride layer. The via-hole 101 may substantially vertically penetrate the first interlayer insulating layer 104 and the substrate 100. The via-hole 101 may be opened toward the top surface 100a and have a depth not reaching the first bottom surface 100b. The via-hole 101 may be formed around the integrated circuit 103, for example, a scribe lane or a region adjacent thereto. The via-hole 101 may be formed in a hollow pillar-shape by an etching process or a drilling process. Alternatively, the via-hole 101 may be formed in a region in which the integrated circuit 103 is formed.

Referring to FIG. 4B, a sacrificial layer 110 may be formed to partially fill the via-hole 101. For example, an insulator may be deposited using a spin coating method, a spray coating method, a spin-on-glass (SOG) method, or a flowable chemical vapor deposition (FCVD) method, so that the sacrificial layer 110 may be formed in the via-hole 101. In the present embodiment, the sacrificial layer 110 may be formed using the FCVD method. The FCVD method may include providing a silicon-contained compound (e.g., organo-silane and/or organo-siloxane) and an oxidizing agent (e.g., ethanol and/or isopropyl alcohol) on the substrate 100, condensing the silicon-contained compound and the oxidizing agent to deposit a flowable layer having Si—O, Si—H, and/or Si—OH combination, and converting the flowable layer to a solid phase silicon oxide layer (e.g., $SiO_2$).

Depositing the flowable layer may be performed at a low temperature (e.g., about −20 degrees Celsius to about 100 degrees Celsius, or about 20 degrees Celsius to about 100 degrees Celsius) under a low pressure (e.g., about 1 Torr to about 100 Torr) without plasma. Converting the flowable layer to the silicon oxide layer may be performed in a plasma environment (e.g., oxygen, helium, and/or argon plasma) or annealing treatment of a temperature of about 200 degrees Celsius and a low pressure (e.g., less than about 10 Torr). Thus, the flowable layer may be solidified and be constricted to be formed into the silicon oxide layer. A thickness or a shape filling the via-hole 101 of the sacrificial layer 110 may be varied according to the process condition. For example, the sacrificial layer 110 may include a tail 110t extending along a sidewall of the via-hole toward the top surface 100a according to flowable characteristic of the flowable layer, which may be generated by the condition of the FCVD process. Alternatively, the sacrificial layer 110 may not include the tail 110t.

Referring to FIG. 4C, an insulating layer 112a may be formed in the via-hole 110 partially filled with the sacrificial layer 110 and then a conductive layer 120a may be formed on the insulating layer 112a. Additionally, a metal layer 124a may further be formed before the conductive layer 120a is formed. The insulating layer 112a may be formed by depositing a silicon oxide layer or a silicon nitride layer on a surface of the sacrificial layer 110 and an inner sidewall of the via-hole 101. The deposition for the formation of the insulating layer 112a may use a chemical vapor deposition, for example, a plasma-enhanced chemical vapor deposition (PECVD). If the conductive layer 120a includes copper (Cu), the metal layer 124a may include a metal capable of preventing or reducing diffusion of copper. For example, the metal layer 124a may be formed by depositing titanium (Ti), chromium (Cr), tantalum (Ta), nickel (Ni), or any combination thereof. The conductive layer 120a may be formed of silicon, copper, tungsten, and/or aluminum by a deposition method or a plating method. If the conductive layer 120a is formed using the plating method, a seed layer may further be formed on the insulating layer 112a. If the metal layer 124a is formed, the seed layer may be formed on the metal layer 124a.

Referring to FIG. 4D, the conductive layer 120a and the insulating layer 112a may be planarized to expose the first interlayer insulating layer 104. The planarization process may be performed by an etch-back process or a chemical mechanical polishing (CMP) process. Due to the planarization process, the conductive layer 120a may be formed into a through-via 120 vertically penetrating the first interlayer insulating layer 104 and the substrate 100, and the insulating layer 112a may be formed into a via-insulating layer 112 electrically insulating the through-via 120 from the substrate 100. If the metal layer 124a is further formed, due to the planarization process, the metal layer 124a may be formed into the barrier layer 124 of FIG. 2A. The barrier layer 124 may prevent or reduce the likelihood of an element (e.g., copper) of the through-via 120 from being diffused into the substrate 100 or the integrated circuit 103.

In other embodiments, as illustrated in FIG. 5A, after the via-insulating layer 112 is formed to extend along the inner surface of the via-hole 101, the sacrificial layer 110 may be formed to fill a lower part of the via-hole 101. And then the through-via 120 may be formed to fill the rest part of the via-hole 101. In still other embodiments, as illustrated in FIG. 5B, after the via-insulating layer 112 is formed to extend along the inner surface of the via-hole 101 and the sacrificial layer is formed to fill the lower part of the via-hole 101, a second via-insulating layer 113 may further be formed. And then the through-via 120 may be formed to fill the via-hole 101. The second via-insulating layer 113 may be formed to extend along the surface of the sacrificial layer 110 and an inner sidewall of the via-insulating layer 112 by the same process as or a similar process to the process for the formation of the via-insulating layer 112.

Referring to FIG. 4E, a back-end process may be performed. In some embodiments, a metal interconnection 152, a bonding pad 154, and a second interlayer insulating layer 106 may be formed on the first interlayer insulating layer 104. The metal interconnection 152 may be connected to the through-via 120 and have a single-layered structure or a multi-layered structure. The bonding pad 154 may be electrically connected to the metal interconnection 152. The second interlayer insulating layer 106 may cover the metal interconnection 152 and the bonding pad 154. The metal interconnection 152 and the bonding pad 154 may be formed by depositing a metal, such as copper or aluminum, and patterning the metal. The second interlayer insulating layer 106 may be formed by depositing the same insulator as or a similar insulator to the first interlayer insulating layer 104, for example, a silicon oxide layer or a silicon nitride layer. An upper insulating layer 107 may be formed on the second interlayer insulating layer 106. The upper insulating layer 107 may be formed by depositing a silicon oxide layer, a silicon nitride layer, or a polymer. The upper insulating layer 107 may be formed to expose the bonding pad 154. Additionally, a bump process may further be performed to form an upper terminal 108 (e.g., a solder ball or a solder bump) connected to the bonding pad 154.

Referring to FIG. 4F, the substrate 100 may be recessed to protrude the through-via 120. For example, the first bottom surface 100b of the substrate 100 may be recessed by an etching process using an etchant or a slurry capable of selectively removing the material (e.g., silicon) constituting the substrate 100, a CMP process, a grinding process, or any combination thereof. The recess process may be performed until a second bottom surface 100c is exposed. Due to the recess process, the through-via 120 may be exposed from the second bottom surface 100c. In embodiments of the inventive concept, the top surface 100a of the substrate 100 may correspond to an active surface and the second bottom surface 100c may correspond to a non-active surface. When the first bottom surface 100b of the substrate 100 is recessed, the sacrificial 110 may be partially etched to be recessed.

In the protruding process of the through-via 120, the through-via 120 may be exposed due to a lack of an etch selectivity between the substrate 100 and the via-insulating layer 112 and/or a thin thickness of the via-insulating layer 112. For example, differently from the present embodiment, if the sacrificial layer 110 does not exist, the via-insulating layer 112 may be removed to expose the through-via 120 due to the lack of the etch selectivity during process recessing the substrate 100. The exposed portion of the through-via 120 may act as a contamination or particle source, which may cause errors in subsequent processing operations. Alternatively, if a diameter or size S of the through-via 120 becomes reduced due to a tendency to shrink a device, an aspect ratio of the via-hole 101 may become greater. This may cause a decrease of the thickness and/or step coverage of the via-insulating layer 112, so that a removal possibility of the via-insulating layer 112 may increase during the recess process of the substrate 100. However, according to the present embodiment, even though the sacrificial layer 110 is partially removed by the recess process of the substrate 100, a residual portion of the sacrificial layer 110 may prevent the through-via 120 from being exposed. Thus, an etch margin of the via-insulating layer 112 may be sufficiently secured due to the sacrificial layer 110 in the protruding process of the through-via 120.

Referring to FIG. 4G, a silicon oxide layer or a silicon nitride layer may be deposited on the second bottom surface 100c of the substrate 100, thereby forming a lower insulating layer 109. The lower insulating layer 109 may cover the second bottom surface 100c of the substrate 100 and the sacrificial layer 110. The lower insulating layer 109, the sacrificial layer 110, and the via-insulating layer 112 may be planarized until the through-via 120 is exposed. The planarization process may be performed by an etching process, a CMP process, a grinding process, or any combination thereof. By the planarization process, the tail 110t may be removed as illustrated in FIG. 4H or the tail 110t may not be removed as illustrated in FIG. 4I.

In some embodiments, referring to FIG. 4H, a lower terminal 118 connected to the through-via 120 may be formed on the planarized lower insulating layer 109. Thus, it may be possible to form the semiconductor device 1 of FIG. 1 including the electrical connection part 11 of the via-middle structure of FIG. 2A having the through-via 120 and the via-insulating layer 112 surrounding the sidewall of the through-via 120. The planarized lower insulating layer 109 may surround a sidewall of the lower end 120b of the through-via 120. The lower end 120b of the through-via 120 may penetrate the lower insulating layer 109 and be coplanar with a bottom surface of the lower insulating layer 109. The lower terminal 118 may be formed to have a re-interconnected pad shape. In the present embodiment, the lower terminal 118 may include a pad and the upper terminal 108 may include a solder ball. However, the inventive concept is not limited thereto. In other embodiments, the upper terminal 108 and the lower terminal 118 may be formed to have a solder ball shape or a pad shape. Alternatively, the upper terminal 108 may be formed into a pad and the lower terminal 118 may be formed into a solder ball. After the integrated circuit 103 and the metal interconnection 152 are sequentially formed, the through-via 120 may be formed. Thus, it may be possible to form the semiconductor device 1 including the electrical connection part 12 having the via-last structure as illustrated in FIG. 2B. After the through-via 120 is formed, the integrated circuit 103 and the metal interconnection 152 may be sequentially formed. Thus, it may be possible to form the semiconductor device 1 including the electrical connection part 13 having the via-first structure as illustrated in FIG. 2C.

In other embodiments, referring to FIG. 4I, the lower terminal 118 connected to the through-via 120 may be formed on the planarized lower insulating layer 109. Thus, it may be possible to form the semiconductor device 1 of FIG. 1 including the electrical connection part 11 a having the through-via 120, the via-insulating layer 112 surrounding the sidewall of the through-via 120, and the tail 110t surrounding the sidewall of the lower end 120b of the through-via 120. The electrical connection part 11a may be formed to have the via-middle structure like the present embodiment. Alternatively, the electrical connection part 11a may be formed to have the via-last structure as illustrated in FIG. 2B or the via-first structure as illustrated in FIG. 2C.

As illustrated in FIG. 4J, the via-insulating layer 112 may surround the sidewall of the lower end 120b of the through-via 120, and a portion of the sacrificial layer 110, for example, the tail 110t may further surround the lower end portion 120b of the through-via 120. The tail 110t may suppress removal of the via-insulating layer 112 in a region 70 adjacent to the second bottom surface 100c of the substrate 100 during the process recessing the substrate 100. Thus, the tail 110t may suppress exposure of the sidewall of the lower end 120b of the through-via 120 adjacent to the second bottom surface 100c of the substrate 100. Moreover, the tail 110t may prevent the through-via 120 from being in contact with the substrate 100. In other embodiments, the sacrificial layer 110 may be removed by the planarization process of the lower insulating layer 109. In still other embodiments, if the sacrificial layer 110 is formed after the via-insulating layer 112 is formed as illustrated in FIG. 5A, the tail 110t may be disposed between the via-insulating layer 112 and the through-via 120 and surround the lower end 120b of the through electrode 120 as illustrated in FIG. 4K. In yet other embodiments, if the second via-insulating layer 113 is formed after the first via-insulating layer 112 and the sacrificial layer 110 are formed as illustrated in FIG. 5B, the tail 110t may be disposed between the first and second via-insulating layers 112 and 113 and surround the lower end 120b of the through electrode 120 as illustrated in FIG. 4L.

<Modified Example of Fabricating Method>

FIGS. 6A to 6H are cross-sectional views illustrating a method for fabricating a semiconductor device according to other embodiments of the inventive concept. FIG. 7A and 7B are cross-sectional views illustrating process examples of FIG. 6B.

Figure 6A:
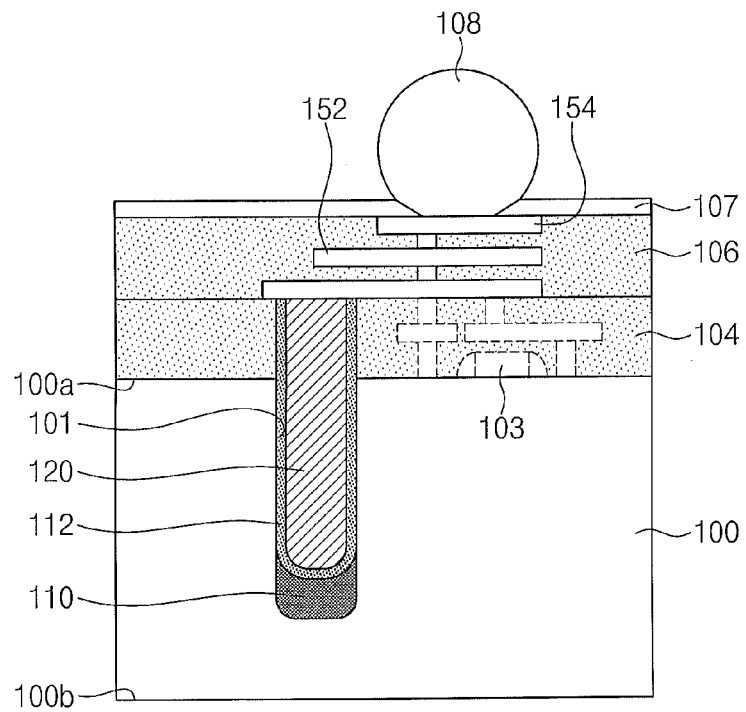
FIGS. 6A to 6H are cross-sectional views illustrating a method for fabricating a semiconductor device according to other embodiments of the inventive concept.
Figure 7A:
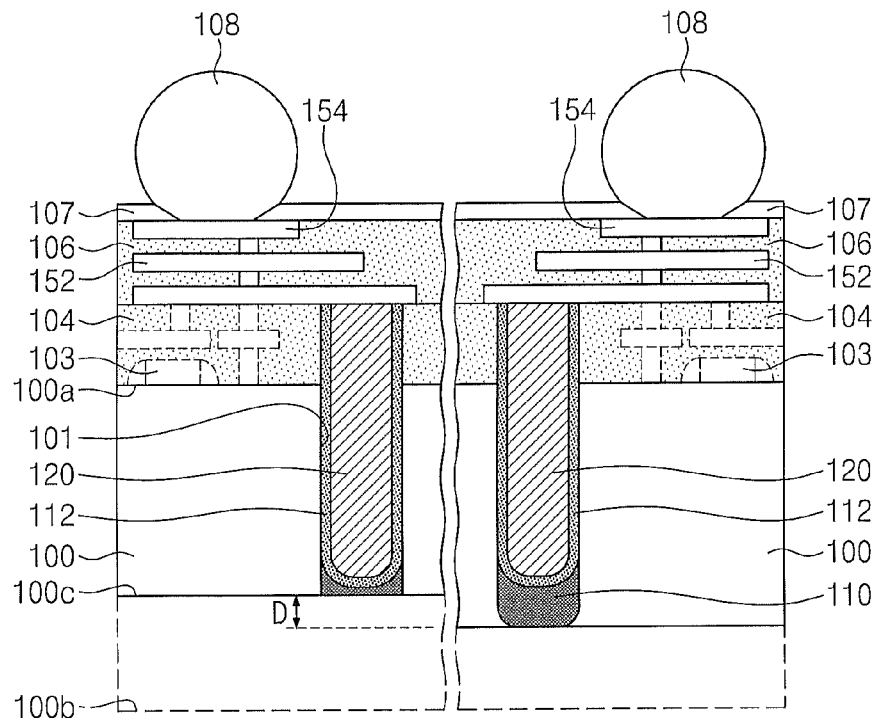
FIG. 7A and 7B are cross-sectional views illustrating process examples of the device of FIG. 6B.
Figure 7B:
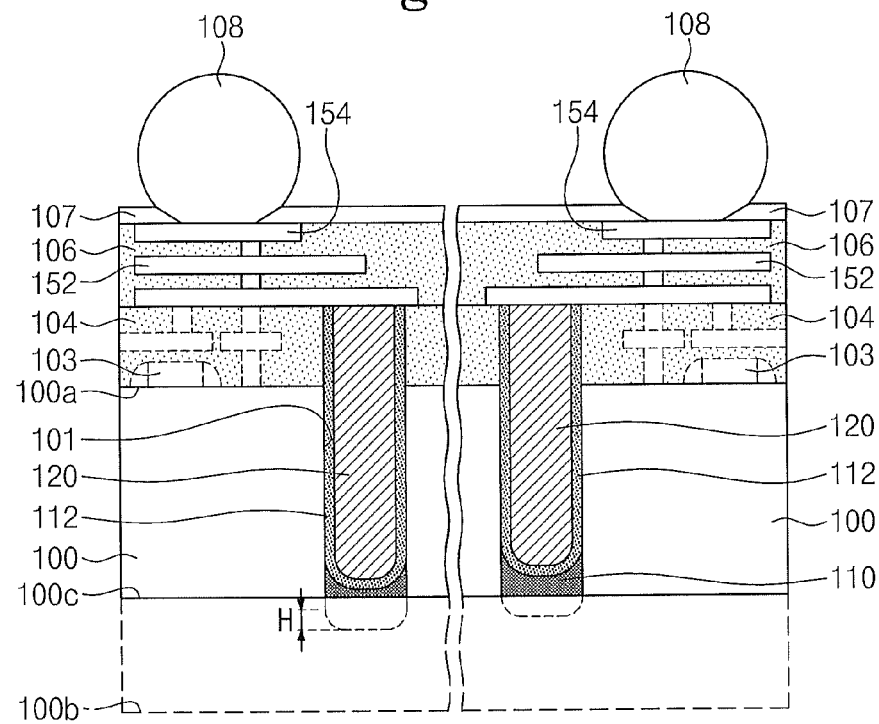

Referring to FIG. 6A, after the integrated circuit 103 is formed by the same processes as or similar processes to the processes described with reference to FIGS. 4A to 4E, the through-via 120 may be formed to penetrate the substrate 100 and then the metal interconnection 152 may be formed to connect the integrated circuit 103 and the through-via 120 to each other. Before the through-via 120 is formed, the sacrificial layer 110 may be formed to fill the lower part of the via-hole 101 by a FCVD method. The sacrificial layer 110 may include the tail 100t or not. In other embodiments, the via-insulating layer 112, the sacrificial layer 110 and the through-via 120 may be sequentially formed as illustrated in FIG. 5A. In still other embodiments, the via-insulating layer 112, the sacrificial layer 110, the second via-insulating layer 113, and the through-via 120 may be sequentially formed as illustrated in FIG. 5B.

Figure 6B:
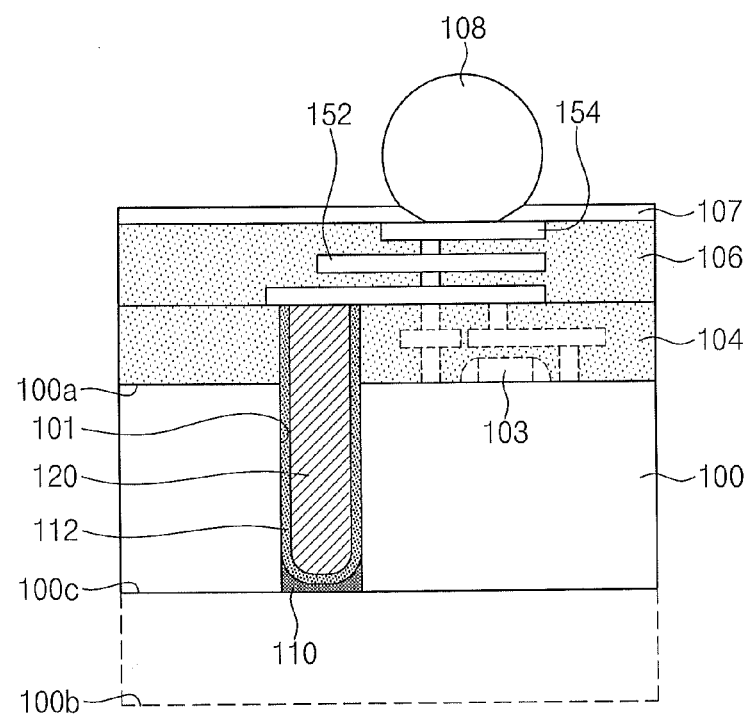

Referring to FIG. 6B, the first bottom surface 100b of the substrate 100 may be recessed. In the present embodiment, the second bottom surface 100c may be formed by recessing the first bottom surface 100b. The through-via 120 may not protrude from the second bottom surface 100c. The sacrificial layer 110 may be partially recessed by the recess process of the first bottom surface 100b. The recess process may be performed by a CMP process, an etching process, a grinding process, or any combination thereof. In the present embodiment, even through the etch selectivity between the substrate 100 and the sacrificial layer 110 is not sufficient, the via-insulating layer 112 and/or the through-via 120 may not be exposed. Because the sacrificial layer 110 is further formed under the through-via 120, the through-via 120 may not be exposed when the first bottom surface 100b of the substrate 100 is recessed. Thus, the recess process may be performed by the etching process rather than the CMP process. As a result, it may be possible to prevent or reduce contamination or particles caused by the exposure of the through-via 120. Even though removing amounts according to regions of the substrate 100 are different from each other or depths of the via-holes 101 are different from each other, the sacrificial layer 110 may prevent the through-vias 120 from being exposed. For example, as illustrated in FIG. 7A, the removing amounts according to the regions of the substrate 100 may be different from each other, so that a height difference D of the second bottom surface 100c may occur. In this case, at least one of the through-vias 120 may be exposed. However, according to embodiments of the inventive concept, the sacrificial layer 110 may compensate for the height difference D. Thus, it may be possible to prevent the through-vias 120 from being exposed. In other embodiments, as illustrated in FIG. 7, the depth difference H of the via-holes 101 may occur. In this case, at least one of the through-vias 120 may be exposed. However, according to embodiments of the inventive concept, the sacrificial layer 110 may compensate for the depth difference H such that it may be possible to prevent the through-vias 120 from being exposed.

Figure 6C:
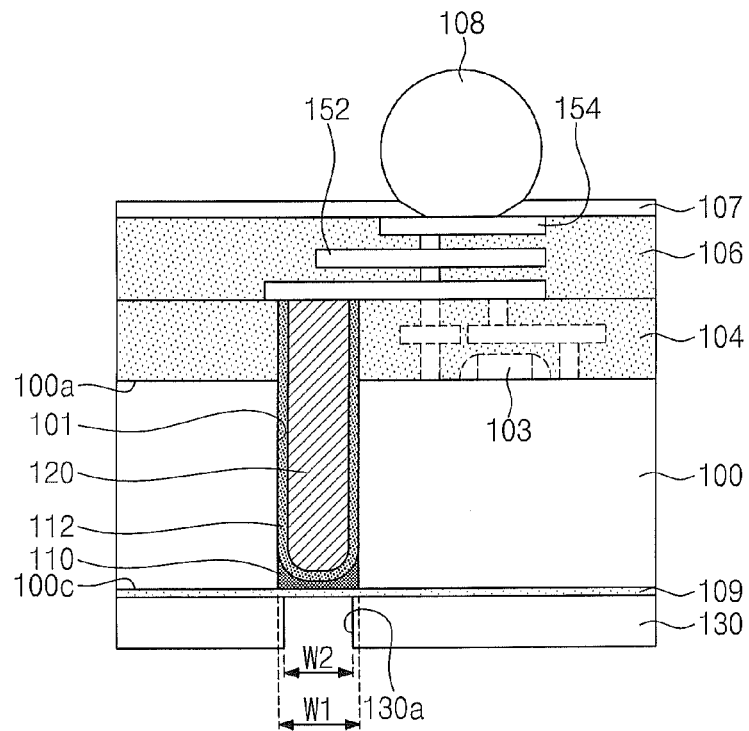

Referring to FIG. 6C, the lower insulating layer 109 may be formed on the second bottom surface 100c of the substrate 100 and then a mask 130 may be formed on the lower insulating layer 109. A photoresist may be coated and then the photoresist may be patterned to form the mask 130. The mask 130 may include an opening pattern 130a vertically aligned with the via-hole 101. The opening pattern 130a may have a width W2 smaller than a width W1 of the via-hole 101.

Figure 6D:
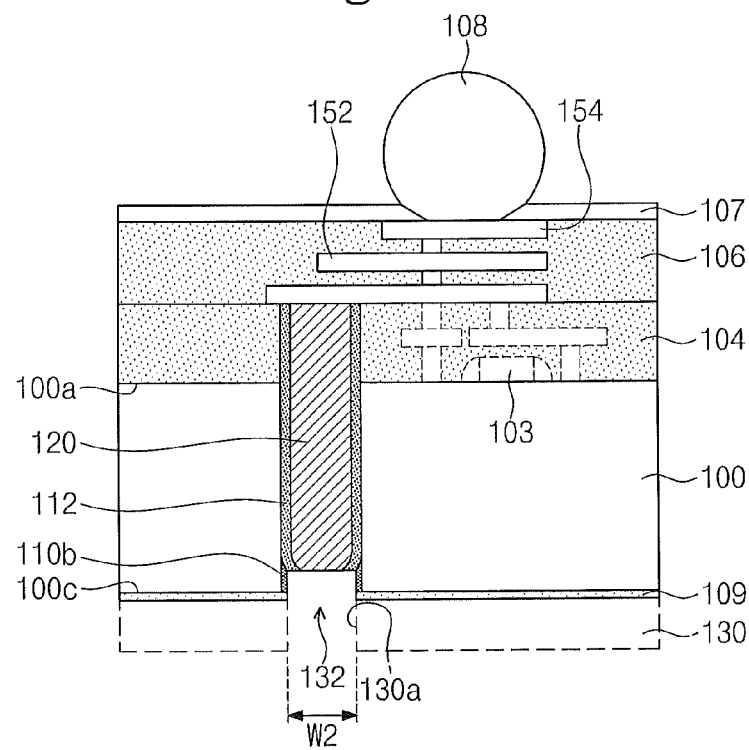

Referring to FIG. 6D, the lower insulating layer 109, the sacrificial layer 110, and the via-insulating layer 112 may be selectively removed by an etching process using the mask 130 as an etch mask. Thus, an opening 132 exposing the through-via 120 may be formed. A sidewall of the opening 132 may consist of a residual sacrificial layer 110b. A thickness of the residual sacrificial layer 110b and/or a width of the opening 132 may be changed according to the width W2 of the opening pattern 130a of the mask 130.

Figure 6E:
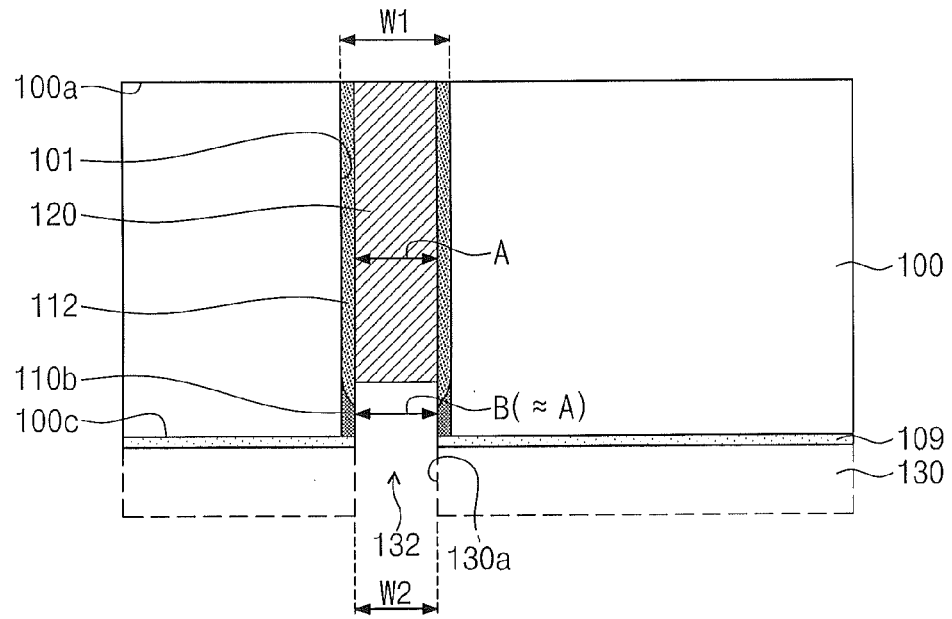

For example, as illustrated in FIG. 6E, if the width W2 of the opening pattern 130a is equal to or similar to a width A of the through-via 120, the residual sacrificial layer 110b may be formed to have a thickness equal to or similar to the thickness of the via-insulating layer 112. And the opening 132 may be formed to have a width B equal to or similar to the width A of the through-via 120.

Figure 6F:
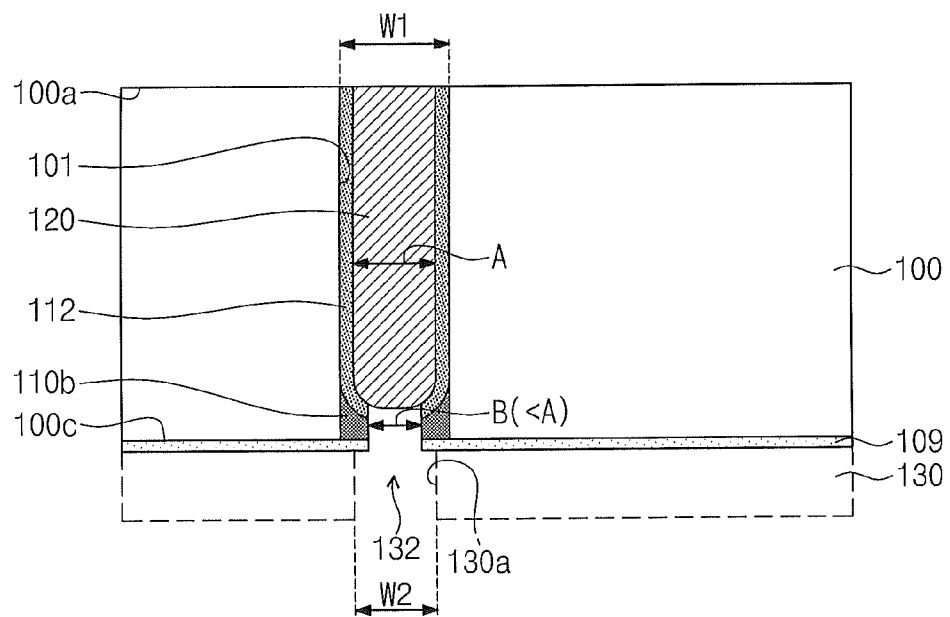

In other examples, as illustrated in FIG. 6F, if the width W2 of the opening pattern 130a is less than the width A of the through-via 120, the residual sacrificial layer 110b may be formed to have a thickness greater than the thickness of the via-insulating layer 112. And the opening 132 may be formed to have a width B less than the width A of the through-via 120.

Figure 6G:
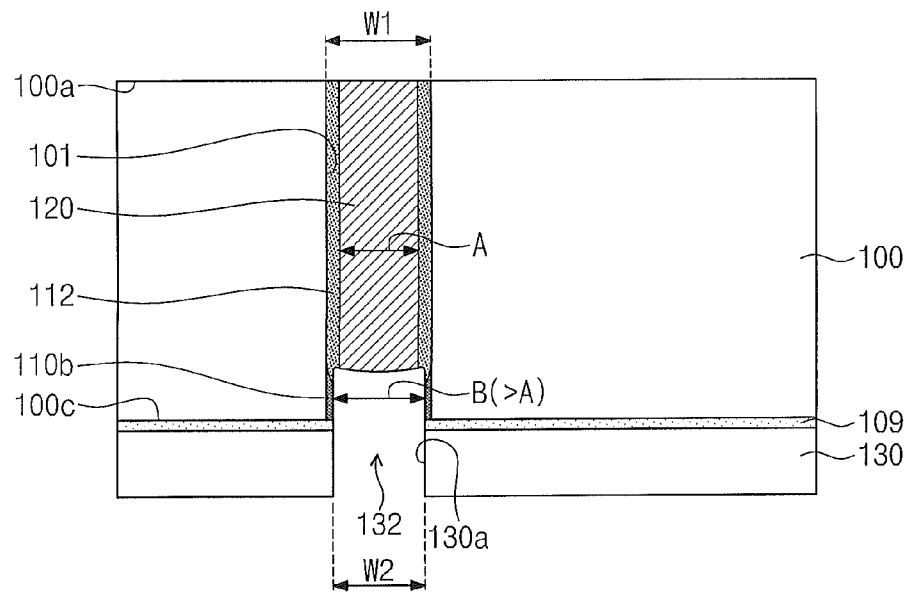

In still other examples, as illustrated in FIG. 6G, if the width W2 of the opening pattern 130a is greater than the width A of the through-via 120, the residual sacrificial layer 110b may be formed to have a thickness less than the thickness of the via-insulating layer 112 or the residual sacrificial layer 110b may be removed. And the opening 132 may be formed to have a width B greater than the width A of the through-via 120. In this case, the thin thickness of the residual sacrificial layer 110b consisting of the sidewall of the opening 132 may not reliably prevent etching damage applied to the substrate 100, and the substrate 100 may be exposed through the opening 132.

In the present embodiment, the lower insulating layer 109 and the sacrificial layer 110 may be selectively removed by the etching process using the mask 130 including the opening pattern 130a which has the width W less than the width W1 of the via-hole 101 and equal to or greater than the width A of the through-via 120. As a result, as illustrated in FIG. 6E, the residual sacrificial layer 110b may have the thickness equal to or similar to the thickness of the via-insulating layer 112, and the opening 132 may have the width B equal to or similar to the width A of the through-via 120. Or, as illustrated in FIG. 6F, the residual sacrificial layer 110b may have the thickness greater than the thickness of the via-insulating layer 112, and the opening 132 may have the width B less than the width A of the through-via 120.

Figure 6H:
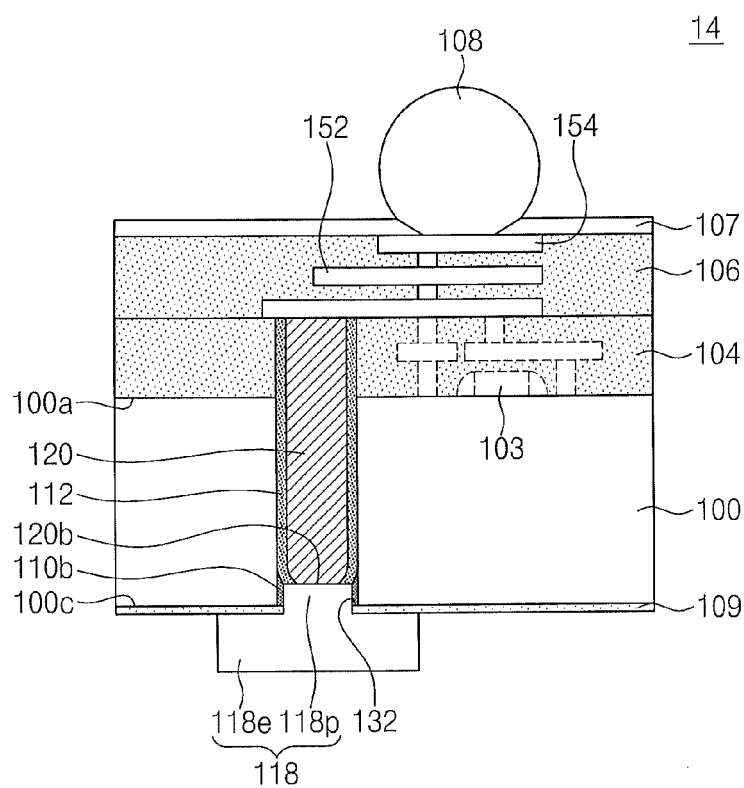

Referring to FIG. 6H, the lower terminal 118 electrically connected to the through-via 120 may be formed on the lower insulating layer 109. The lower terminal 118 may include an extending portion 118e extending along the second bottom surface 100c of the substrate 100 and a protruded portion 118p extending from the extending portion 118e into the opening 132. The protruded portion 118p is connected to the lower end 120b of the through-via 120. The extending portion 118e of the lower terminal 118 may be re-interconnected. The protruded portion 118p may be electrically insulated from the substrate 100 by the residual sacrificial layer 110b, and the extending portion 118e may be electrically insulated from the substrate 100 by the lower insulating layer 109. In other embodiments, the lower terminal 118 may be formed to have a solder bump shape or a solder ball shape.

The semiconductor device 1 of FIG. 1 including the electrical connection part 14 of the via-middle structure of FIG. 2D having the recessed through-via 120 may be formed through the processes described above. In other embodiments, it may be possible to form the semiconductor device 1 including the electrical connection part 12 having the via-last structure as illustrated in FIG. 2B. Alternatively, it may be possible to form the semiconductor device 1 including the electrical connection part 13 having the via-first structure as illustrated in FIG. 2C.

<Applications>

Figure 8A:
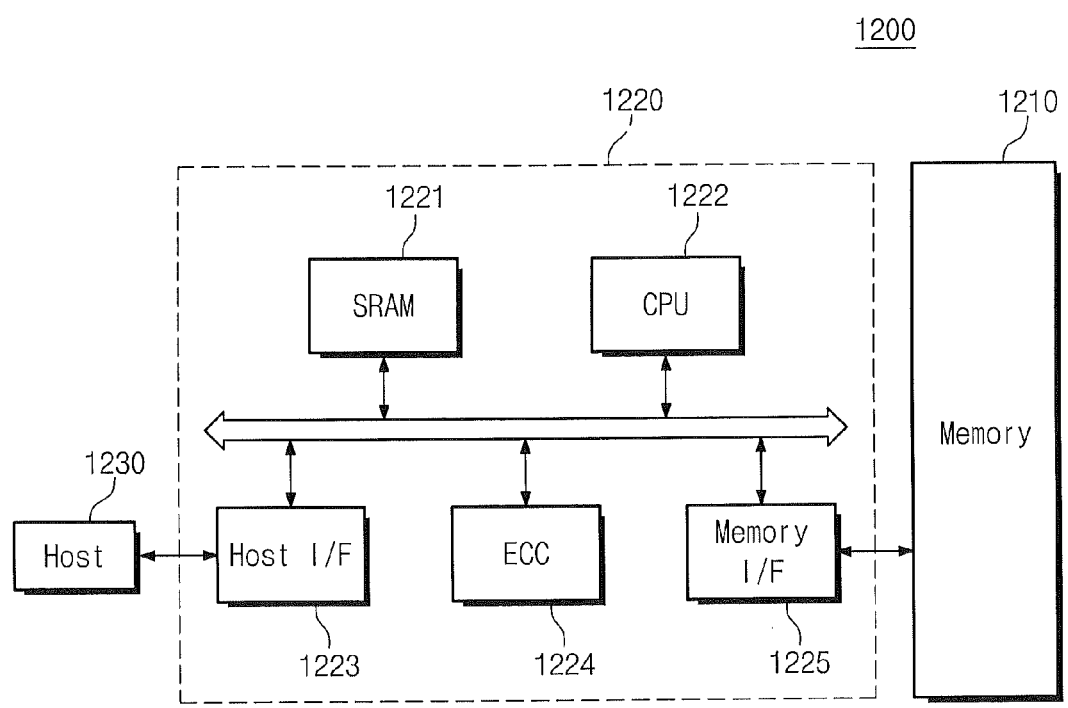
FIG. 8A is a schematic block diagram illustrating an example of memory cards including semiconductor devices according to embodiments of the inventive concept.
Figure 8B:
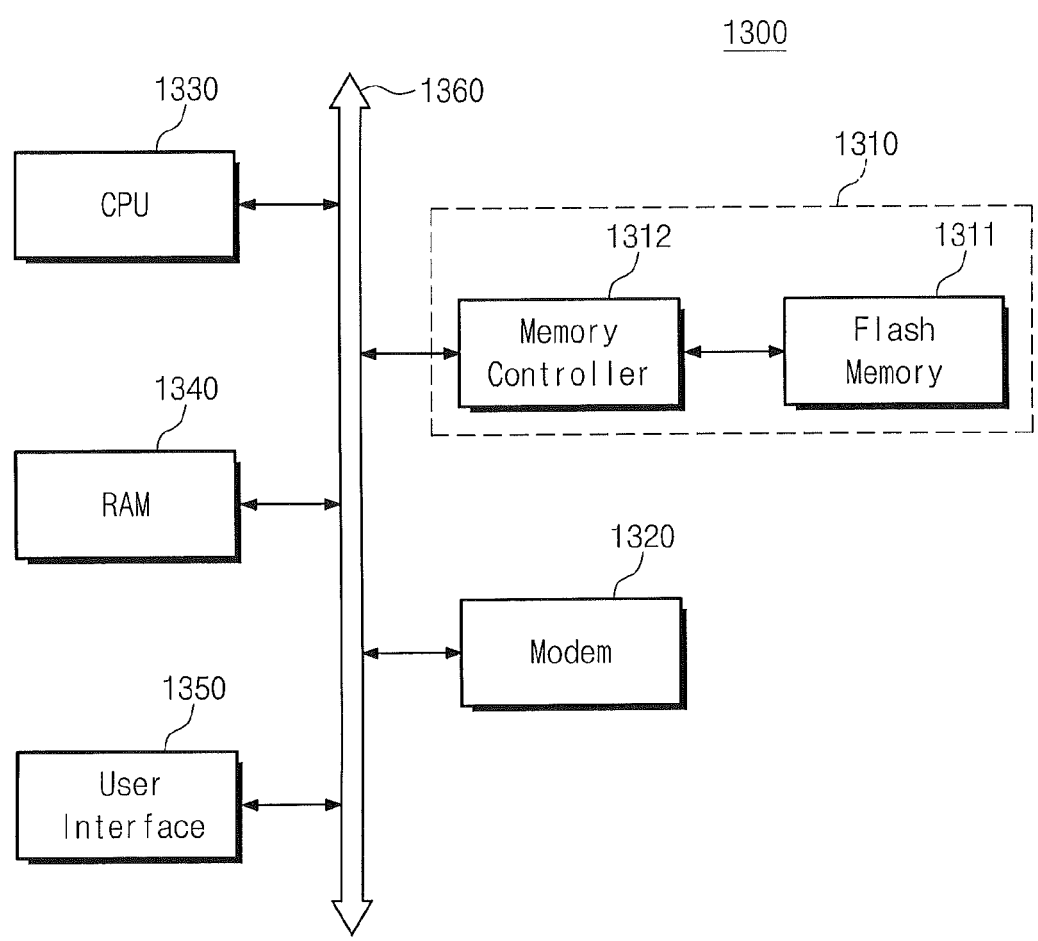
FIG. 8B is a schematic block diagram illustrating an example of information processing systems including semiconductor devices according to embodiments of the inventive concept.

FIG. 8A is a schematic block diagram illustrating an example of memory cards including semiconductor devices according to embodiments of the inventive concept. FIG. 8B is a schematic block diagram illustrating an example of information processing systems including semiconductor devices according to embodiments of the inventive concept.

Referring to FIG. 8A, a memory card 1200 may include a memory controller 1220 that controls data communication between a host and the memory device 1210. An SRAM device 1221 may be used as an operation memory of a central processing unit (CPU) 1222. A host interface unit 1223 may be configured to include a data communication protocol between the memory card 1200 and the host. An error check and correction (ECC) block 1224 may detect and correct errors of data, which are read out from the memory device 1210. A memory interface unit 1225 may interface with the memory device 1210. The CPU 1222 may perform overall operations for data exchange of the memory controller 1220. The memory device 1210 may include at least one of the semiconductor device 1 and the semiconductor package 90 according to embodiments of the inventive concept.

Referring to FIG. 8B, an information processing system 1300 may include a memory system 1310 provided with at least one of the semiconductor device 1 and the semiconductor package 90 according to embodiments of the inventive concept. The information process system 1300 may include a mobile device or a computer. For example, the information system 1300 may include the memory system 1310, a modem 1320, a central processing unit (CPU) 1330, a RAM 1340, a user interface unit 1350. The memory system 1310 may include a memory device 1311 and a memory controller 1312. The memory system 1310 may consist of the same elements as the memory card 1200 of FIG. 8A. The memory system 1310 may store data processed by the CPU 1330 or data input from an external system. The information processing system 1300 may further include a memory card, a solid state disk (SSD), and/or other application chipsets.

According to embodiments of the inventive concept, because the flowable chemical vapor deposition layer is formed under the through-via, a thickness of the insulating layer of the through-via may be reinforced. Thus, it is possible to secure an etching margin of the insulating layer of the through-via during the process of protruding the through-via. As a result, contamination or particles caused by the exposure of the through-via may be prevented or reduced to improve yield and electrical characteristics of the semiconductor device. Additionally, the flowable chemical vapor deposition layer may compensate for the height difference of the bottom surface of the substrate and/or the depth difference of the via-holes, such that process errors may be prevented or minimized.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
    a substrate having an active surface, a non-active surface, and a via-hole extending from the active surface to the non-active surface;
    a through-via provided in the via-hole;
    a via-insulating layer extending along an inner sidewall of the via-hole and surrounding a sidewall of the through-via;

a sacrificial layer extending along the inner sidewall of the via-hole from the via-insulating layer to the non-active surface of the substrate;

a lower insulating layer covering the non-active surface of the substrate; and a terminal provided on the lower insulating layer and electrically connected to the through-via.

2. The semiconductor device of claim 1, wherein the sacrificial layer comprises a flowable chemical vapor deposition layer; and wherein the via-insulating layer comprises a non-flowable chemical vapor deposition layer.

3. The semiconductor device of claim 2, wherein the through-via includes a lower end that protrudes outward from the non-active surface of the substrate; and wherein the sacrificial layer surrounds a sidewall of the lower end of the through-via.

4. The semiconductor device of claim 2, wherein the through-via comprises a lower end not reaching the non-active surface of the substrate;

wherein the terminal includes a protruded portion which protrudes toward the via-hole and is connected to the lower end of the through-via; and wherein the protruded portion is electrically insulated from the substrate by the sacrificial layer.

5. The semiconductor device of 4, wherein the sacrificial layer has a thickness substantially equal to that of the via-insulating layer, and wherein the protruded portion of the terminal has a width substantially equal to a width of the lower end of the through-via.

6. The semiconductor device of claim 4, wherein the sacrificial layer has a thickness greater than that of the via-insulating layer, and wherein the protruded portion of the terminal has a width less than that of the lower end of the through-via.

7. A method for fabricating a semiconductor device, comprising:

forming a hole opened toward a top surface of a substrate, the hole partially penetrating the substrate;

forming a sacrificial layer partially filling the hole;

forming a through-via in the hole partially filled with the sacrificial layer;

forming a via-insulating layer between the through-via and the substrate; and exposing the through-via through a bottom surface of the substrate, wherein forming the sacrificial layer comprises:
forming an insulating flowable layer on the substrate; and
constricting the insulating flowable layer to form a solidified flowable layer;

wherein forming the via-insulating layer comprises:
after forming the sacrificial layer, forming an insulating layer extending along a surface of the sacrificial layer and an inner sidewall of the hole.

8. The method of claim 7, wherein exposing the through-via comprises:

recessing the bottom surface of the substrate to expose a lower end of the through-via, the lower end of the through-via being surrounded by the sacrificial layer;

forming a lower insulating layer covering the sacrificial layer on the recessed bottom surface; and planarizing the lower insulating layer and the sacrificial layer to expose the lower end of the through-via.

9. The method of claim 7, further comprising:

forming a barrier metal layer between the via-insulating layer and the through-via.

10. The method of claim 7, wherein forming the via-insulating layer comprises:

before forming the sacrificial layer, forming a first insulating layer extending an inner surface of the hole.

11. The method of claim 10, wherein forming the via-insulating layer further comprises:

after forming the sacrificial layer, forming a second insulating layer extending a surface of the sacrificial layer and an inner sidewall of the first insulating layer in the hole.

12. The method of claim 7, wherein forming the insulating flowable layer comprises:

providing a silicon-contained compound and an oxidizing agent on the substrate; and condensing the silicon-contained compound and the oxidizing agent.

13. The method of claim 12, wherein forming the solidified flowable layer comprises:

performing a plasma treatment or an annealing treatment on the insulating flowable layer to convert the insulating flowable layer into a constricted silicon oxide layer having a solid phase.

14. A method for fabricating a semiconductor device, comprising:

forming a hole opened toward a top surface of a substrate, the hole partially penetrating the substrate;

forming a sacrificial layer partially filling the hole;

forming a through-via in the hole partially filled with the sacrificial layer;

forming a via-insulating layer between the through-via and the substrate; and exposing the through-via through a bottom surface of the substrate, wherein forming the sacrificial layer comprises:
forming an insulating flowable layer on the substrate; and
constricting the insulating flowable layer to form a solidified flowable layer;

wherein exposing the through-via comprises:
recessing the bottom surface of the substrate to expose the sacrificial layer without protruding the through-via;
forming a lower insulating layer on the recessed bottom surface; and
selectively removing the sacrificial layer and the via-insulating layer to expose a lower end of the through-via.

* * * * *